US012605749B2

(12) United States Patent
Kim

(10) Patent No.: US 12,605,749 B2
(45) Date of Patent: Apr. 21, 2026

(54) SOLDER REFLOW SYSTEM AND SOLDER REFLOW METHOD USING THE SAME

(71) Applicant: Samsung Electronics Co., Ltd., Suwon-si (KR)

(72) Inventor: Youngja Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 426 days.

(21) Appl. No.: 18/202,128

(22) Filed: May 25, 2023

(65) Prior Publication Data

US 2024/0120310 A1 Apr. 11, 2024

(30) Foreign Application Priority Data

Oct. 17, 2022 (KR) ........................ 10-2022-0133182

(51) Int. Cl.
*H01L 23/00* (2006.01)
*B08B 3/12* (2006.01)
(52) U.S. Cl.
CPC ................ *H01L 24/75* (2013.01); *B08B 3/12* (2013.01); *H01L 24/83* (2013.01);
(Continued)
(58) Field of Classification Search
CPC ..... H01L 24/83; H01L 24/75; H01L 21/7684; H01L 21/321; H01L 21/76879; H01L 21/76814; H01L 21/32115; H01L 21/28568; H01L 21/28556; H01L 21/76843; H01L 23/53209; H01L 21/28562; H01L 21/3212; H01L 21/76882; H01L 2224/83912; H01L 2224/83815;
(Continued)

(56) References Cited

U.S. PATENT DOCUMENTS 5,011,546 A 4/1991 Frazier et al.
5,038,496 A * 8/1991 Mishina ................. B23K 1/015
34/78
(Continued)

FOREIGN PATENT DOCUMENTS

JP H09-232372 A 9/1997
JP 6794857 B2 12/2020
(Continued)

*Primary Examiner* — Mouloucoulaye Inoussa
(74) *Attorney, Agent, or Firm* — Muir Patent Law, PLLC

(57) ABSTRACT
A solder reflow system may include a solder reflow apparatus, a condensation apparatus and a cleaning apparatus. The solder reflow apparatus may be configured to reflow a solder of a semiconductor package using a heat transfer fluid. The condensation apparatus may be configured to receive the semiconductor package processed by the solder reflow apparatus. The condensation apparatus may condensate a gas generated from the heat transfer fluid to convert the gas into a liquid. The cleaning apparatus may be configured to clean the semiconductor package processed by the condensation apparatus using a cleaning agent. Thus, the heat transfer fluid stained with the semiconductor package may be removed by the condensation apparatus so that the heat transfer fluid may not be introduced into the cleaning apparatus. As a result, the heat transfer fluid may not be mixed with the cleaning agent to maintain cleaning capacity of the cleaning agent.

20 Claims, 6 Drawing Sheets

(52) U.S. Cl.
CPC ................. *H01L 2224/7501* (2013.01); *H01L 2224/75101* (2013.01); *H01L 2224/83815* (2013.01); *H01L 2224/83912* (2013.01)

(58) Field of Classification Search
CPC ... H01L 2224/75101; H01L 2224/7501; B08B 3/12; B23K 1/008; B23K 2101/42; B23K 37/047; B23K 3/04; B23K 37/0282; B23K 1/015; B23K 1/0016; B23K 1/012; B23K 37/0211; H05K 13/0465; C23C 16/56; C23C 16/18; C23C 16/045
See application file for complete search history.

(56) References Cited

U.S. PATENT DOCUMENTS

| | | | |
|---|---|---|---|
| 7,748,600 B2 | 7/2010 | Leicht | |
| 11,143,974 B1 * | 10/2021 | Moon | ....................... G03F 1/66 |
| 2002/0178705 A1 * | 12/2002 | Mullins | ................. B23K 1/008 55/385.2 |

| | | | |
|---|---|---|---|
| 2007/0099411 A1 * | 5/2007 | Matsui | ................... H01L 24/742 438/106 |
| 2009/0206145 A1 * | 8/2009 | Tamori | ................... B23K 1/008 228/15.1 |
| 2013/0200136 A1 * | 8/2013 | Besshi | ................... B23K 1/015 228/42 |
| 2017/0110316 A1 * | 4/2017 | Park | ..................... H10D 62/151 |
| 2017/0121602 A1 * | 5/2017 | Modi | ................... C09K 11/883 |
| 2018/0090446 A1 * | 3/2018 | Kawasaki | ........... H01L 21/7684 |
| 2019/0134553 A1 * | 5/2019 | Richter | ................. B01D 47/06 |
| 2019/0314917 A1 * | 10/2019 | Nagai | ................. B23K 1/0016 |
| 2020/0098593 A1 * | 3/2020 | Hirano | ................... G03F 7/426 |
| 2021/0069810 A1 * | 3/2021 | Rehm | ................... B23K 1/008 |
| 2022/0362873 A1 * | 11/2022 | Ozawa | ............. H01J 37/32816 |

FOREIGN PATENT DOCUMENTS

| | | |
|---|---|---|
| KR | 10-2005-0070242 A | 7/2005 |
| KR | 10-2011-0094965 A | 8/2011 |

* cited by examiner

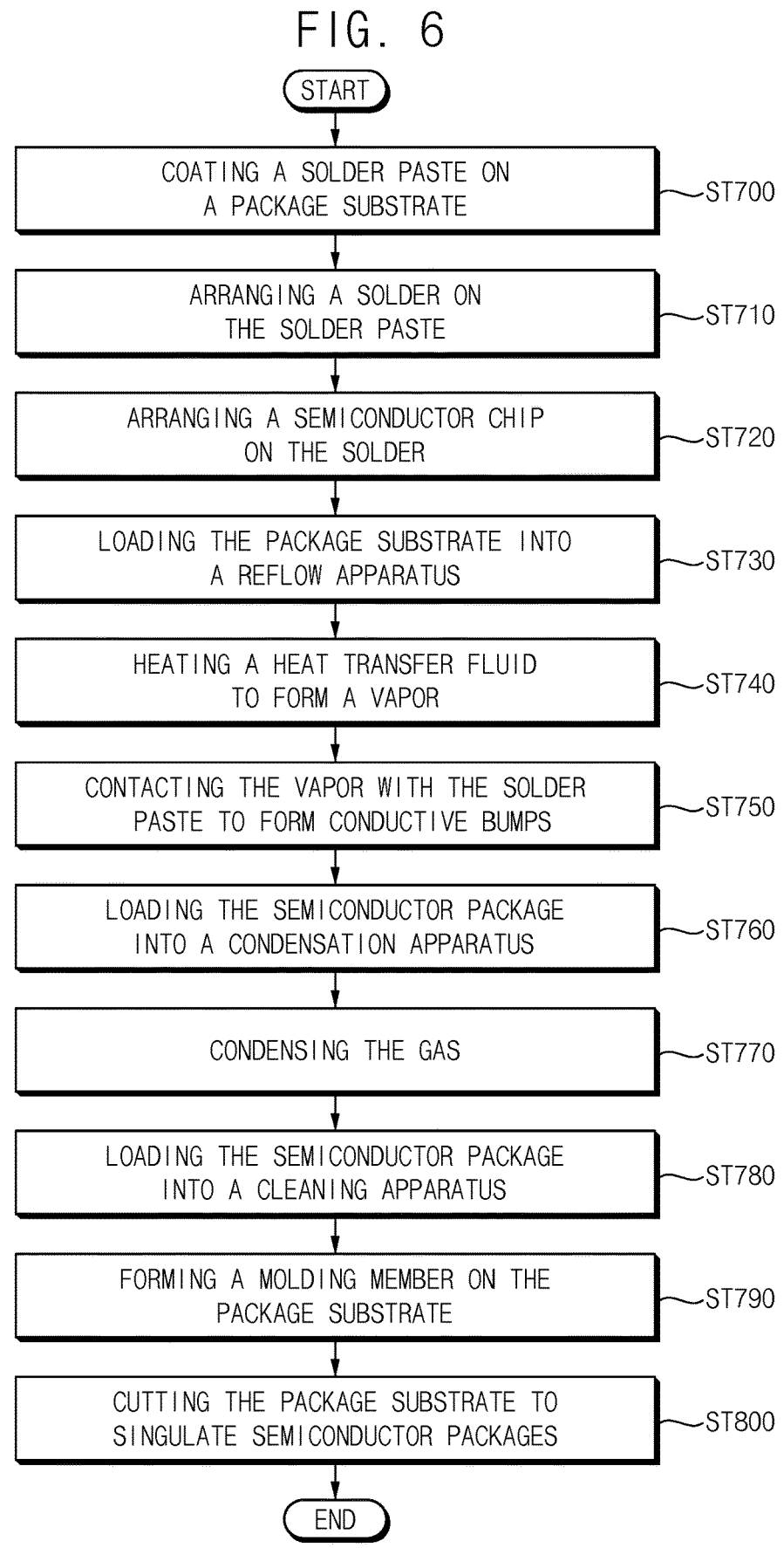

START

COATING A SOLDER PASTE ON
A PACKAGE SUBSTRATE —— ST700

ARRANGING A SOLDER ON
THE SOLDER PASTE —— ST710

ARRANGING A SEMICONDUCTOR CHIP
ON THE SOLDER —— ST720

LOADING THE PACKAGE SUBSTRATE INTO
A REFLOW APPARATUS —— ST730

HEATING A HEAT TRANSFER FLUID
TO FORM A VAPOR —— ST740

CONTACTING THE VAPOR WITH THE SOLDER
PASTE TO FORM CONDUCTIVE BUMPS —— ST750

LOADING THE SEMICONDUCTOR PACKAGE
INTO A CONDENSATION APPARATUS —— ST760

CONDENSING THE GAS —— ST770

LOADING THE SEMICONDUCTOR PACKAGE
INTO A CLEANING APPARATUS —— ST780

FORMING A MOLDING MEMBER ON THE
PACKAGE SUBSTRATE —— ST790

CUTTING THE PACKAGE SUBSTRATE TO
SINGULATE SEMICONDUCTOR PACKAGES —— ST800

END

SOLDER REFLOW SYSTEM AND SOLDER REFLOW METHOD USING THE SAME

CROSS-RELATED APPLICATION

This application claims priority under 35 USC § 119 to Korean Patent Application No. 10-2022-0133182, filed on Oct. 17, 2022 in the Korean Intellectual Property Office (KIPO), the contents of which are herein incorporated by reference in their entirety.

BACKGROUND

1. Field

Example embodiments relate to a solder reflow system and a solder reflow method using the same. More particularly, example embodiments relate to a solder reflow system using a vapor phase soldering and a method of soldering a solder using the solder reflow system.

2. Description of the Related Art

In a surface mount technology, a convection reflow, a laser assisted bonding, a vapor phase soldering, etc. may be used for soldering a solder paste. In the vapor phase soldering, a heated heat transfer fluid may transfer heat to a solder for mounting an electronic part such as a semiconductor package on a substrate. After transferring the heat, the heat transfer fluid may be condensed to form a liquid.

According to related arts, after the solder reflow process, a process for cleaning the semiconductor package using deionized water may be performed. The heat transfer fluid remaining on the semiconductor package may be mixed with the deionized water. The deionized water mixed with the heat transfer fluid may have low cleaning capacity.

Further, when fumes generated in the solder reflow process stains the semiconductor package, appearance quality of the semiconductor package may be deteriorated. Thus, in order to remove the fumes, it may be required to periodically clean the solder reflow apparatus.

SUMMARY

Example embodiments provide a solder reflow system that may be capable of preventing a heat transfer fluid and a cleaning agent from being mixed.

Example embodiments also provide a solder reflow method using the above-mentioned solder reflow system.

According to example embodiments, there may be provided a solder reflow system. The solder reflow system may include a solder reflow apparatus, a condensation apparatus and a cleaning apparatus. The solder reflow apparatus may be configured to reflow a solder of a semiconductor package using a heat transfer fluid. The condensation apparatus may be configured to receive the semiconductor package processed by the solder reflow apparatus. The condensation apparatus may be configured to condensate a gas generated from the heat transfer fluid to convert the gas into a liquid. The cleaning apparatus may be configured to clean the semiconductor package processed by the condensation apparatus using a cleaning agent.

According to example embodiments, there may be provided a solder reflow system. The solder reflow system may include a solder reflow apparatus, a condensation apparatus, an inlet line, a cleaning apparatus and a return line. The solder reflow apparatus may be configured to reflow a solder of a semiconductor package using a heat transfer fluid. The condensation apparatus may be configured to receive the semiconductor package processed by the solder reflow apparatus. The condensation apparatus may be configured to condense a gas generated from the heat transfer fluid to convert the gas into a liquid. The inlet line may be connected between the solder reflow apparatus and the condensation apparatus to introduce the gas generated in the solder reflow apparatus into the condensation apparatus. The cleaning apparatus may perform an ultrasonic cleaning process on the semiconductor package processed by the condensation apparatus using deionized water. The return line may be connected between the solder reflow apparatus and the condensation apparatus to return the liquid formed by the condensation apparatus into the solder reflow apparatus.

According to example embodiments, there may be provided a method of manufacturing a semiconductor device. The method may include reflowing a solder of a semiconductor package using a heat transfer fluid in a reflow chamber. A gas generated from the heat transfer fluid may be condensed using a condensation apparatus to convert the gas into a liquid. The semiconductor package may then be cleaned using a cleaning apparatus.

According to example embodiments, the condensation apparatus arranged between the solder reflow apparatus and the cleaning apparatus may condensate the gas generated from the heat transfer fluid to convert the gas into the liquid. Thus, the heat transfer fluid stained with the semiconductor package may be removed by the condensation apparatus so that the heat transfer fluid may not be introduced into the cleaning apparatus. As a result, the heat transfer fluid may not be mixed with the cleaning agent to maintain cleaning capacity of the cleaning agent.

BRIEF DESCRIPTION OF THE DRAWINGS

Example embodiments will be more clearly understood from the following detailed description taken in conjunction with the accompanying drawings.

FIGS. 1 to 6 represent non-limiting, example embodiments as described herein.

FIG. 1 is a cross-sectional view illustrating a solder reflow system according to example embodiments;

FIG. 2 is a cross-sectional view illustrating a solder reflow system according to example embodiments;

FIG. 3 is a cross-sectional view illustrating a solder reflow system according to example embodiments;

FIG. 4 is a cross-sectional view illustrating a solder reflow system according to example embodiments;

FIG. 5 is a cross-sectional view illustrating a solder reflow system according to example embodiments; and FIG. 6 is a flow chart illustrating a method of reflowing a solder using the solder reflow system in FIG. 1.

DETAILED DESCRIPTION OF THE EMBODIMENTS

Figure 3:
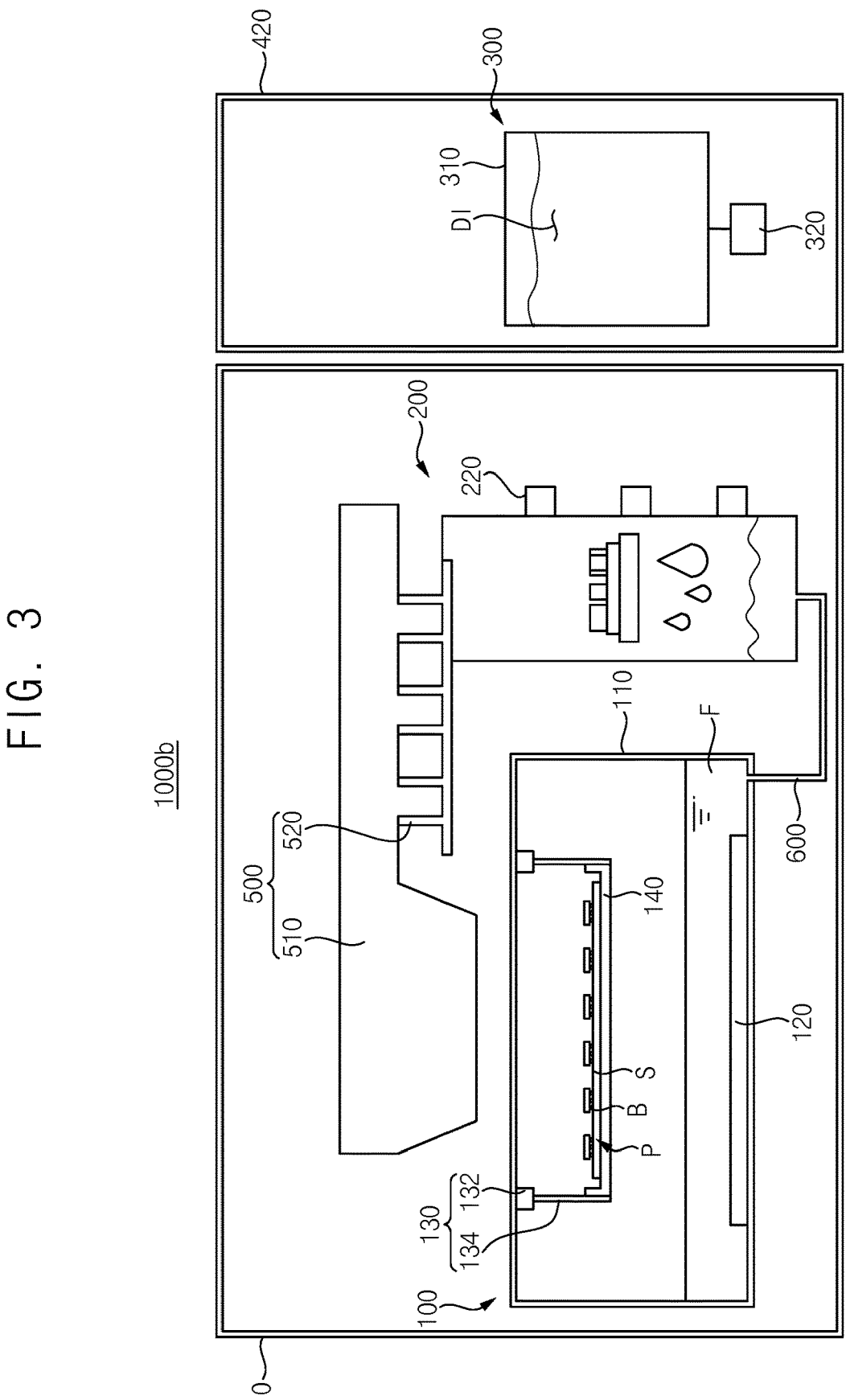

Hereinafter, example embodiments will be explained in detail with reference to the accompanying drawings.

Figure 1:
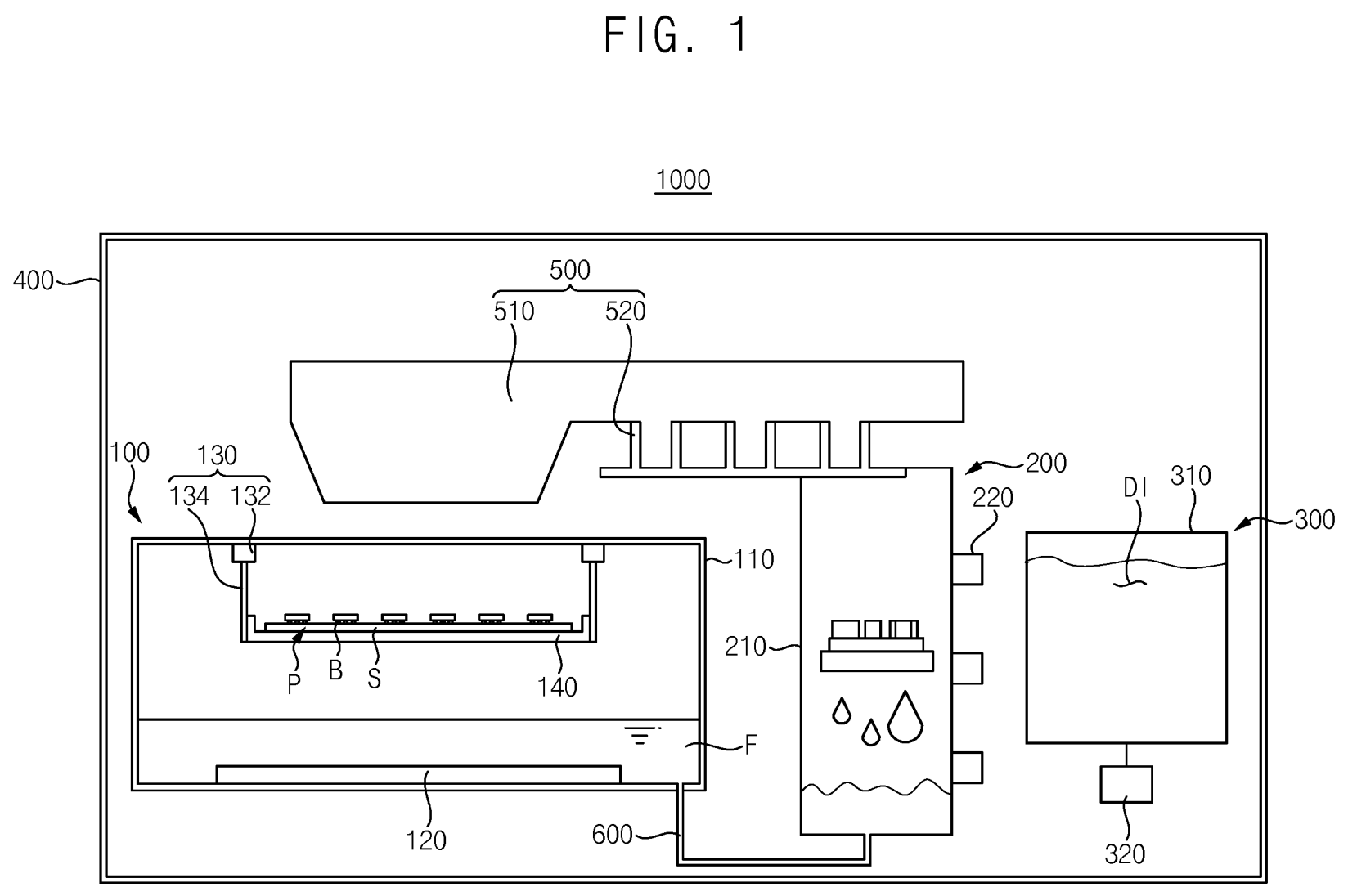

FIG. 1 is a cross-sectional view illustrating a solder reflow system according to example embodiments.

Referring to FIG. 1, a solder reflow system 1000 of example embodiments may include a solder reflow apparatus 100, a condensation apparatus 200 and a cleaning apparatus 300.

In example embodiments, the solder reflow apparatus 100, the condensation apparatus and the cleaning apparatus

300 may be arranged in one system chamber 400. For example, the solder reflow apparatus 100, the condensation apparatus 200 and the cleaning apparatus 300 may be sequentially arranged in the system chamber 400. Thus, the condensation apparatus 200 may be positioned between the solder reflow apparatus 100 and the cleaning apparatus 300.

The solder reflow apparatus 100 may be used for soldering an electronic part/device/chip on a substrate. For example, the solder reflow apparatus 100 may be used for manufacturing a semiconductor package P. For example, the semiconductor package P may include a package substrate S, a semiconductor chip C, conductive bumps B, etc. The package substrate S may correspond to the substrate. The semiconductor chip C may correspond to the electronic part/device. The conductive bumps B may be interposed between the package substrate S and the semiconductor chip C. The conductive bumps B may be attached to the package substrate S and the semiconductor chip C by a soldering process performed by the solder reflow apparatus 100.

The solder reflow apparatus 100 may include a reflow chamber 110, a heater 120, a stage 140 and a lift 130. The solder reflow apparatus 100 may further include a temperature sensor configured to monitor a temperature in the reflow chamber 110.

In example embodiments, the solder reflow apparatus 100 may correspond to or may be a vapor phase soldering type apparatus (e.g., a vapor phase soldering apparatus or a condensation soldering apparatus) configured to solder a solder paste by a heated saturated vapor in the reflow chamber 110. For example, the vapor used in the vapor phase soldering apparatus may be a superheated vapor. For example, the superheated vapor may be formed when the vapor is heated beyond the boiling point of the material forming the vapor at atmospheric pressure. For example, the superheated vapor may be in a gaseous phase. For example, the superheated vapor may be a gas.

The reflow chamber 110 may include a reservoir configured to receive a heat transfer fluid F. The reservoir may be a lower region in the reflow chamber 110. The reflow chamber 110 may include a space filled with a gas (e.g., the superheated vapor) generated by heating the heat transfer fluid F. The space may be a remaining space in the reflow chamber 110 except for the reservoir. The reflow chamber 110 may extend in a vertical direction to have a height. The vapor, which may be generated by evaporating the heat transfer fluid F, may move upwardly. The vapor may be condensed to form a liquid. The liquid may move downwardly. The liquid may then be collected in the reservoir.

Spatially relative terms, such as "beneath," "below," "lower," "above," "upper," "vertical," "horizontal" and the like, may be used herein for ease of description to describe positional relationships as illustrated in the figures. It will be understood that the spatially relative terms encompass different orientations of the device in addition to the orientation depicted in the figures.

An internal pressure of the reflow chamber 110 may be an atmospheric pressure. Alternatively, the reflow chamber 110 may be connected to an exhaust apparatus such as a vacuum pump to control the internal pressure of the reflow chamber 110. The internal pressure of the reflow chamber 110 may be maintained for changing a boiling point of the heat transfer fluid F or for soldering environments. For example, the internal pressure of the reflow chamber 110 may be different from the atmospheric pressure in certain embodiments to change the boiling temperature of the heat transfer fluid F within the reflow chamber 110 and/or to maintain a soldering condition.

The heat transfer fluid F may be a chemical for providing the vapor used for the soldering. The heat transfer fluid F may be selected based on the boiling point of the heat transfer fluid F, environment influences, corrosiveness of the vapor, etc. The heat transfer fluid F may include or may be an inert organic liquid. For example, the heat transfer fluid F may include or may be a Galden solution in perfluoropolyether (PFPEs). The Galden solution may have a boiling point of about 230° C.

The heater 120 may heat the heat transfer fluid F in the reflow chamber 110 to generate a saturated vapor. The heater 120 may include an electrical resistor dipped into the heat transfer fluid F on a bottom surface of the reflow chamber 110. Alternatively, the heater 120 may include a coil-shaped resistor configured to surround the reservoir. For example, the heater 120 may heat the heat transfer fluid F with an electric energy.

Additionally, a heater as a part of a temperature controller may be installed at a sidewall of the reflow chamber 110 to control internal temperatures of the reflow chamber 110.

The stage 140 may be movably arranged in the reflow chamber 110 in the vertical direction. The lift 130 may move/lift the stage 140. The lift 130 may include an actuator (e.g., a mechanism to move the stage 140) such as a transfer rail, a transfer screw, a transfer belt, etc. Transfer rods 134 may support both ends of the stage 140. A linear actuator 132 may lift the stage 140 along the transfer rods 134.

The condensation apparatus 200 may be connected to the solder reflow apparatus 100 through an inlet line 500. The gas generated from the heat transfer fluid F in the solder reflow apparatus 100 may be introduced into the condensation apparatus 200 through the inlet line 500. Further, fumes generated in the solder reflow apparatus 100 may also be introduced into the inlet line 500. For example, the fumes may include the gas/vapor made from the heat transfer fluid and/or other substances generated as a byproduct during the solder reflow process in the reflow chamber 110.

The inlet line 500 may include a main duct 510 and at least one branch duct 520. One end of the main duct 510 may be connected to an upper surface of the solder reflow apparatus 100, e.g., an upper surface of the reflow chamber 110, e.g., such that the gas formed from the heat transfer fluid to move from the reflow chamber 110 into the main duct 510. The other end of the main duct 510 may extend over the condensation apparatus 200. The branch duct 520 may downwardly extend from the main duct 510. The branch duct 520 may be connected to an upper surface of the condensation apparatus 200. Thus, the gas and the fume may be introduced into the branch duct 520 through the main duct 510.

In example embodiments, the inlet line 500 may include a plurality of branch ducts 520. While the fume moves through the branch ducts 520, the fume may stain inner surfaces of the branch ducts 520. The branch ducts 520 may provide the fume with a long movement path to suppress the fume from staining the semiconductor package P in the condensation apparatus 200. Thus, only the gas generated from the heat transfer fluid F may be introduced into the condensation apparatus 200 through the branch ducts 520. For example, substantial amount of the fume moved into the branch ducts 520 may be captured on inner surfaces of the branch ducts 520, thereby highly purified gas passes may move into the condensation apparatus 200 through the branch duct 520.

The condensation apparatus 200 may include a condensation chamber 210 and at least one chiller 220. The condensation chamber 210 may be configured to receive the semiconductor package P processed by the solder reflow apparatus 100. The branch ducts 520 may be connected to an upper surface of the condensation chamber 210. Thus, the gas generated from the heat transfer fluid F may be introduced into the condensation chamber 210 from the reflow chamber 110 through the main duct 510 and the branch ducts 520.

The chiller 220 may be installed on an outer surface of the condensation chamber 210 to provide the gas with a condensation temperature. For example, the chiller 220 may be a cooler configured to cool down the temperature of the gas introduced into the condensation chamber 210. In example embodiments, the condensation apparatus 200 may include three chillers 220 on the outer surface of the condensation chamber 210, but the present disclosure is not limited thereto.

Therefore, the gas introduced into the condensation chamber 210 may be condensed by a cold air provided from the chiller 220 so that the gas may be converted into a liquid. For example, the chiller 220 may provide a cold air or a cold gas into the condensation chamber 210 to cool down the temperature of the gas introduced from the reflow chamber 110. For example, the semiconductor package P in the condensation chamber 210 may be lyophilized by the cold air from the chiller 220 to remove the gas and/or liquid, i.e., the heat transfer fluid F from the semiconductor package P. The liquid may then be collected on a bottom surface of the condensation chamber 210. In certain embodiments, the chiller 220 may use another cooling mechanism, e.g., a cold plate, etc., with or without providing the cold air and/or the cold gas into the condensation chamber 210.

The liquid collected on the bottom surface of the condensation chamber 210 may be returned to the reflow chamber 110 of the solder reflow apparatus 100 through a return line/pipe 600. One end of the return line/pipe 600 may be connected to the bottom surface of the condensation chamber 210, but the present disclosure is not limited thereto. The other end of the return line 600 may be connected to a bottom surface of the reflow chamber 110, but the present disclosure is not limited thereto. For example, one end of the return line 600 may be connected to a side surface of the condensation chamber 210. The other end of the return line 600 may be connected to a side surface of the reflow chamber 110. For example, the return pipe/line 600 may be connected to the reflow chamber 110 and the condensation chamber 210 such that the liquid collected from the condensation chamber 210 to flow into the reflow chamber 110 through the return pipe/line 600.

Therefore, because the condensation apparatus 200 may lyophilize the semiconductor package P, the heat transfer fluid F may not be introduced into the cleaning apparatus 300. Thus, the heat transfer fluid F may not be mixed with a cleaning agent of the cleaning apparatus 300 so that cleaning capacity of the cleaning agent may be improved/maintained. Further, the liquid collected in the condensation apparatus 200 may be returned to the solder reflow apparatus 100 through the return line 600 to reuse the returned liquid in a following reflow process, which may reduce manufacturing cost of semiconductor packages.

In certain embodiments, the main duct 510 and/or the branch ducts 520 may be a passage through which semiconductor package P moves from the reflow chamber 110 to the condensation chamber 210 after the semiconductor package P is processed in the reflow chamber 110. In some embodiments, the main duct 510 and the branch ducts 520 may be fluid passages, through which only the fluids (e.g., gas, vapor, fume, etc.) move from the reflow chamber

110 to the condensation chamber 210, and the semiconductor package P moves from the reflow chamber 110 to the condensation chamber 210 through a passage other than the main duct 510 and the branch ducts 520 after the semiconductor package P is processed in the reflow chamber 110.

The cleaning apparatus 300 may receive the semiconductor package P processed by the condensation apparatus 200. The cleaning apparatus 300 may clean the semiconductor package P using the cleaning agent. As mentioned above, because the heat transfer fluid F on the semiconductor package P may be condensed by the condensation apparatus 200 and the liquid may be returned to the solder reflow apparatus 100, the heat transfer fluid F may not be introduced into the cleaning apparatus 300. Thus, the heat transfer fluid F may not be mixed with the cleaning agent to improve/maintain the cleaning capacity of the cleaning agent. In example embodiments, the cleaning agent may include deionized water DI, but the present disclosure is not limited thereto.

In example embodiments, the cleaning apparatus 300 may include or may be an ultrasonic cleaning apparatus. The ultrasonic cleaning apparatus may apply ultrasonic waves to the deionized water DI to clean the semiconductor package P. The ultrasonic cleaning apparatus may include or may be one of various well-known types of apparatus.

The cleaning apparatus 300 may include a cleaning chamber 310 and an ultrasonic wave applier 320. The cleaning chamber 310 may receive the deionized water DI. The semiconductor package P processed by the condensation apparatus 200 may be loaded into the cleaning chamber 310. The semiconductor package P may then be dipped into the deionized water DI. The ultrasonic wave applier 320 may apply the ultrasonic wave to the deionized water DI to clean the semiconductor package P by vibrations of the deionized water DI.

Figure 2:
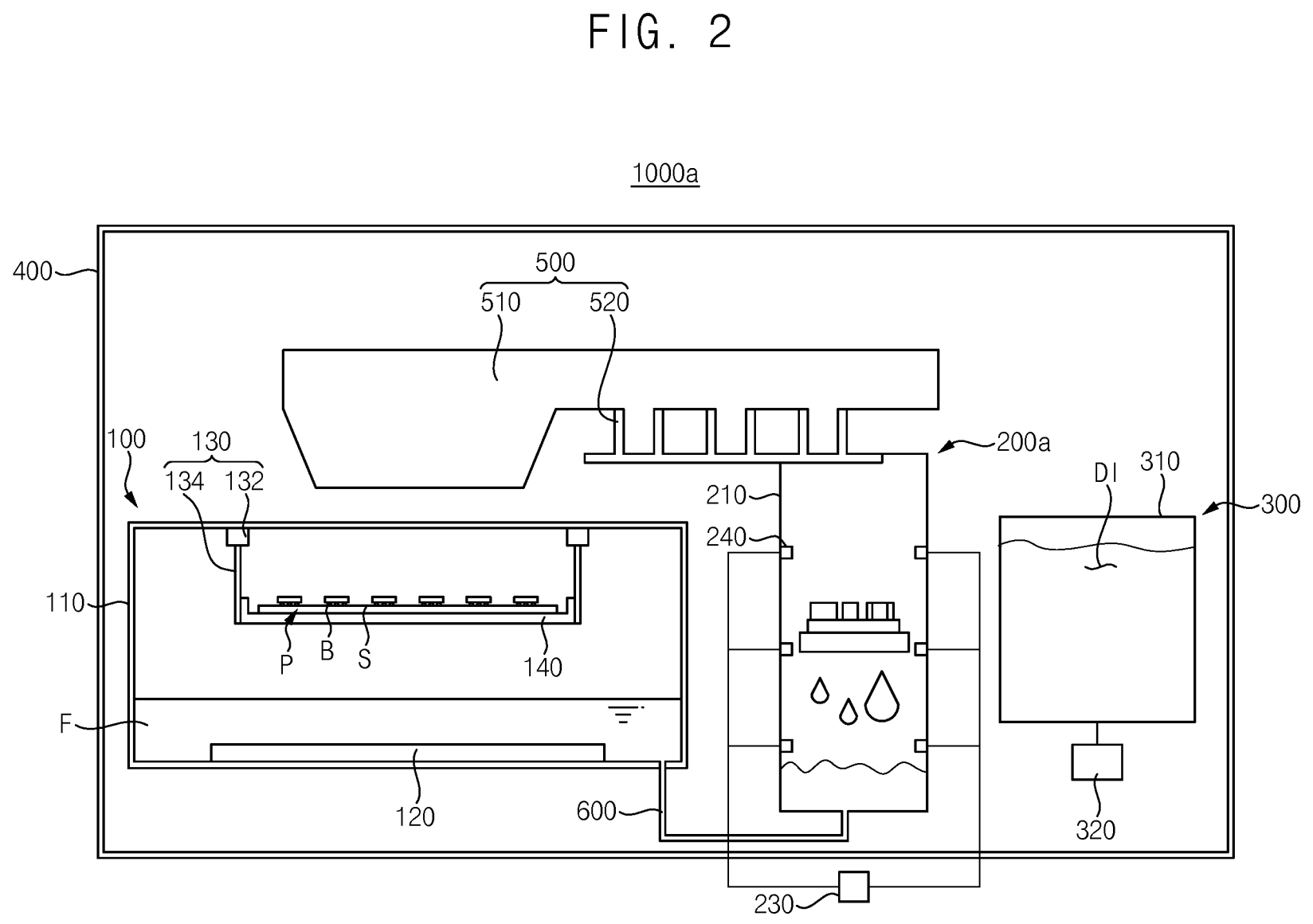

FIG. 2 is a cross-sectional view illustrating a solder reflow system according to example embodiments.

A solder reflow system 1000a of example embodiments may include elements substantially the same or the same as those of the solder reflow system 1000 in FIG. 1 except for a condensation apparatus. Thus, the same reference numerals may refer to the same elements and any further descriptions with respect to the same elements may be omitted herein for brevity.

Referring to FIG. 2, a condensation apparatus 200a of example embodiments may include a condensation chamber 210, a dry gas tank 230 and at least one nozzle 240. The condensation chamber 210 may receive the semiconductor package P processed by the solder reflow apparatus 100. The branch ducts 520 may be connected to an upper surface of the condensation chamber 210. Thus, the gas generated from the heat transfer fluid F may be introduced into the condensation chamber 210 from the reflow chamber 110 through the main duct 510 and the branch ducts 520.

The nozzle 240 may be arranged on an inner surface of the condensation chamber 210. The nozzle 240 may be connected to the dry gas tank 230, e.g., such that a gas is provided from the dry gas tank 230 to the condensation chamber 210 through the nozzle 240. The nozzle 240 may inject a dry gas provided from the dry gas tank 230 into the condensation chamber 210. In example embodiments, the condensation apparatus 200a may include three nozzles 240 on the inner surface of the condensation chamber 210, but the present disclosure is not limited thereto.

The gas introduced into the condensation chamber 210 may be condensed by the dry gas injected from the nozzle 240 so that the gas may be converted into the liquid. For example, the semiconductor package P loaded into the condensation chamber 210 may be dried by the dry gas to remove the gas, e.g., the heat transfer fluid F from the semiconductor package P. In example embodiments, the dry gas may include or may be dry air, but the present disclosure is not limited thereto.

FIG. 3 is a cross-sectional view illustrating a solder reflow system according to example embodiments.

A solder reflow system 1000b of example embodiments may include elements substantially the same or the same as those of the solder reflow system 1000 in FIG. 1 except for a system chamber. Thus, the same reference numerals may refer to the same elements and any further descriptions with respect to the same elements may be omitted herein for brevity.

Referring to FIG. 3, the solder reflow system 1000b may include a first system chamber 410 and a second system chamber 420. The first system chamber 410 may receive the solder reflow apparatus 100 and the condensation apparatus 200. The second system chamber 420 may receive the cleaning apparatus 300. The first system chamber 410 and the second system chamber 420 may be connected to each other in an in-line way.

Figure 4:
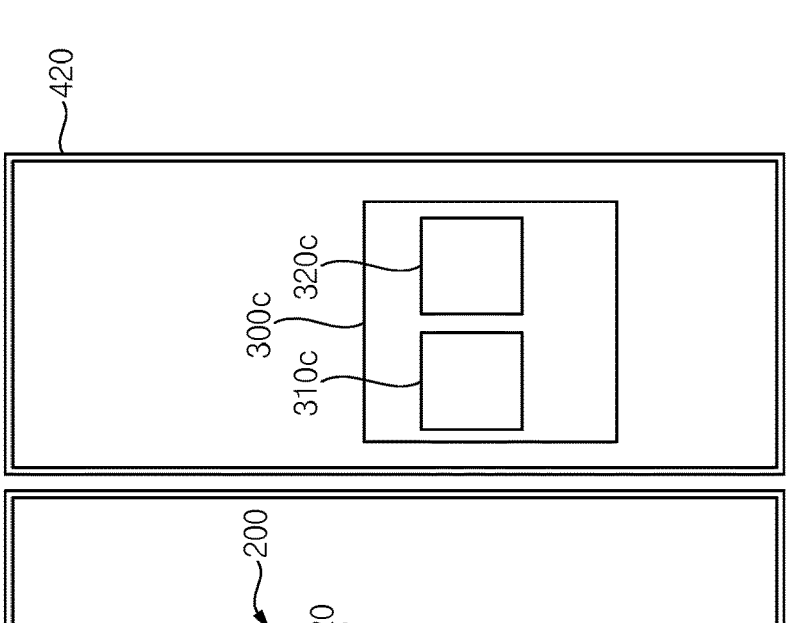

FIG. 4 is a cross-sectional view illustrating a solder reflow system according to example embodiments.

A solder reflow system 1000c of example embodiments may include elements substantially the same or the same as those of the solder reflow system 1000 in FIG. 1 except for a cleaning apparatus. Thus, the same reference numerals may refer to the same elements and any further descriptions with respect to the same elements may be omitted herein for brevity.

Referring to FIG. 4, a cleaning apparatus of example embodiments may include a flush cleaning apparatus 300c. The flush cleaning apparatus 300c may include a cleaning region 310c and a drying region 320c. The cleaning region 310c may inject the cleaning agent to the semiconductor package P. The drying region 320c may dry the cleaning agent on the semiconductor package P.

Figure 5:
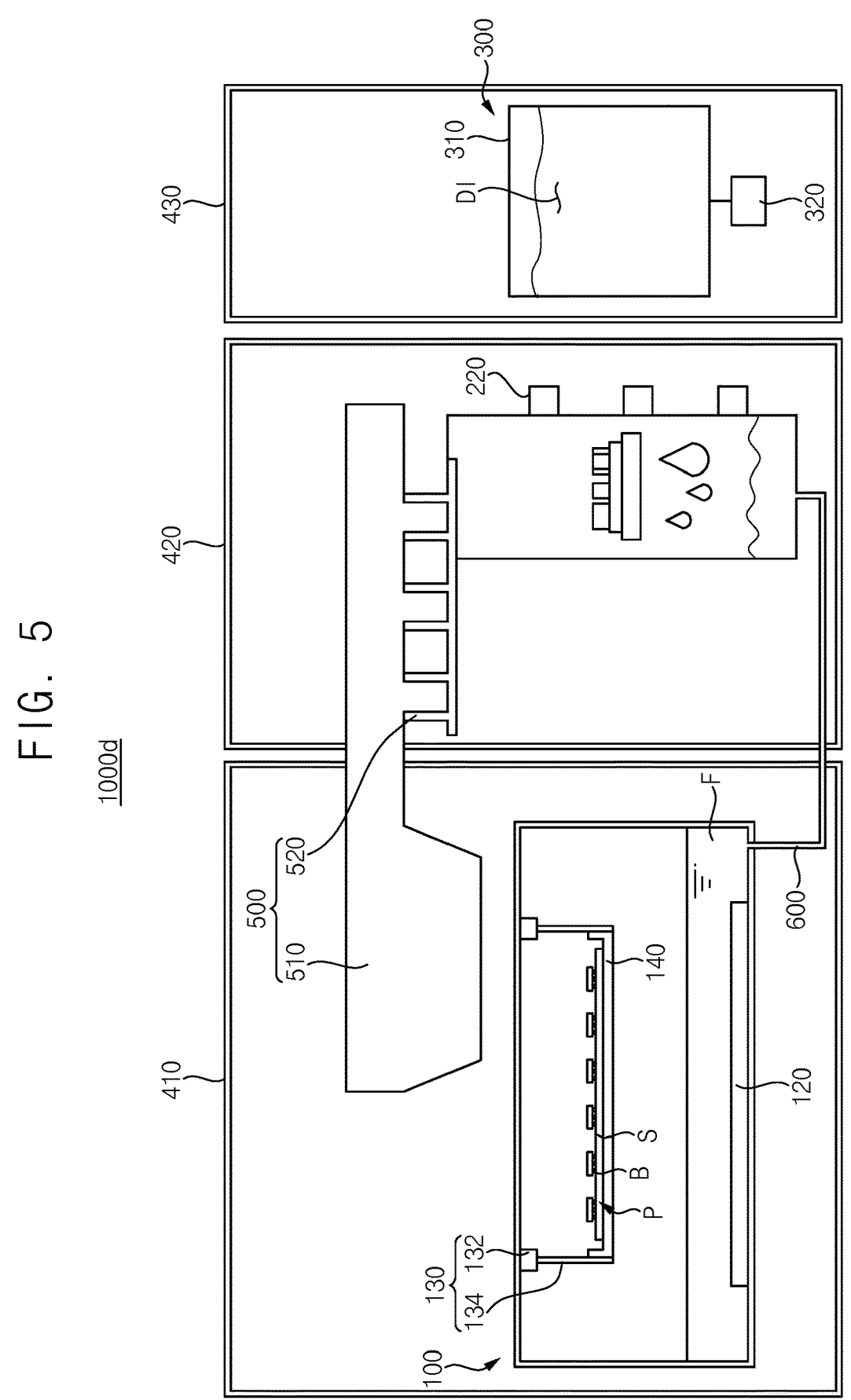

FIG. 5 is a cross-sectional view illustrating a solder reflow system according to example embodiments.

A solder reflow system 1000d of example embodiments may include elements substantially the same or the same as those of the solder reflow system 1000 in FIG. 1 except for a system chamber. Thus, the same reference numerals may refer to the same elements and any further descriptions with respect to the same elements may be omitted herein for brevity.

Referring to FIG. 5, the solder reflow system 1000d may include a first system chamber 410, a second system chamber 420 and a third system chamber 430. The first system chamber 410 may receive the solder reflow apparatus 100. The second system chamber 420 may receive the condensation apparatus 200. The third system chamber 430 may receive the cleaning apparatus 300. The first system chamber 410, the second system chamber 420 and the third system chamber 430 may be connected to each other in a cluster way.

FIG. 6 is a flow chart illustrating a method of reflowing a solder using any one of the solder reflow systems illustrated in FIGS. 1 through 5.

Referring to FIGS. 1 and 6, in step ST700, the solder paste may be coated on the upper surface of the package substrate S.

The solder paste may be printed on the package substrate S. For example, the solder paste may be printed by a stencil printer. The stencil printer may include a plurality of openings corresponding to an arrangement of the conductive bumps B.

In step ST710, the solder may be arranged on the solder paste.

In step ST720, the semiconductor chip C may be arranged on the solder.

In step ST730, the package substrate S with the semiconductor chip C may be loaded into the reflow chamber 100.

In step ST740, the heater 110 may heat the heat transfer fluid F to form the vapor from the heat transfer fluid F.

In step ST750, the lift 130 may move the stage 200 upwardly and/or downwardly (e.g., in a vertical direction) to contact the vapor with the solder paste. The solder paste may be heated to reflow the solder, thereby forming the conductive bumps B between the package substrate S and the semiconductor chip C.

In step ST760, the semiconductor package P may be loaded into the condensation chamber 210 of the condensation apparatus 200. Further, the gas may also be introduced into the condensation chamber 210 through the inlet line 500. In contrast, the fume generated in the reflow process may stain the inner wall of the branch ducts 520.

In step ST770, the chiller 220 may form a condensation atmosphere/condition in the condensation chamber 210 to convert the gas into the liquid. The liquid may be collected on the bottom surface of the condensation chamber 210. The collected liquid may then be returned to the reflow chamber 110 of the solder reflow apparatus 100 through the return line 600. Thus, a reuse ratio of the collected liquid, i.e., the heat transfer fluid F may be improved.

In step ST780, the semiconductor package P may be loaded into the cleaning chamber 310 of the cleaning apparatus 300. The semiconductor package P may be dipped into the cleaning agent in the cleaning chamber 310. Because the heat transfer liquid F may be removed by the condensation apparatus 200, the heat transfer fluid F may not be mixed with the cleaning agent. Thus, the cleaning capacity of the cleaning agent may be improved/maintained to improve cleaning efficiency of the semiconductor package P.

In step ST790, after the cleaning process, a molding member may be formed on the package substrate S to cover the semiconductor chip C.

In step ST800, the package substrate S may be cut along scribe lanes to singulate the semiconductor packages P.

By the above-mentioned processes, the semiconductor package P including a logic device or a memory device and a semiconductor module including the semiconductor package P may be manufactured. For example, the semiconductor package P may include the logic device such as a central processing unit (CPU), an application processor (AP), etc., a volatile memory device such as an SRAM device, a DRAM device, an HBM device, etc., and a non-volatile memory device such as a flash memory device, a PRAM device, an MRAM device, an RRAM device. For example, the method of reflowing a solder illustrated in FIG. 6 may be a method of manufacturing a semiconductor device as described above.

According to example embodiments, the condensation apparatus arranged between the solder reflow apparatus and the cleaning apparatus may condense the gas generated from the heat transfer fluid to convert the gas into the liquid. Thus, the heat transfer fluid staining the semiconductor package may be removed by the condensation apparatus so that the heat transfer fluid may not be introduced into the cleaning apparatus. As a result, the heat transfer fluid may not be mixed with the cleaning agent to maintain/improve cleaning capacity of the cleaning agent.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context indicates otherwise.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A solder reflow system comprising:
a solder reflow apparatus configured to reflow a solder of a semiconductor package comprises the solder reflow apparatus configured to perform vapor phase soldering by heating a heat transfer fluid to generate a super-heated vapor, the superheated vapor comprising a gas;
a condensation apparatus configured to:
receive the semiconductor package processed by the solder reflow apparatus,
receive, from the solder reflow apparatus, at least a portion of the gas generated by the solder reflow apparatus, and
to condense the at least portion of the gas into a liquid; and
a cleaning apparatus configured to clean the semiconductor package processed by the condensation apparatus using a cleaning agent.

2. The solder reflow system of claim 1, further comprising an inlet line connected between the solder reflow apparatus and the condensation apparatus to introduce the gas generated in the solder reflow apparatus into the condensation apparatus.

3. The solder reflow system of claim 2, wherein the inlet line comprises:
a main duct extending from an upper surface of the solder reflow apparatus to an upper space of the condensation apparatus; and
a branch duct connected between the main duct and the condensation apparatus.

4. The solder reflow system of claim 3, wherein the inlet line comprises a plurality of branch ducts configured to remove a fume generated by soldering the solder.

5. The solder reflow system of claim 1, wherein the condensation apparatus comprises:
a condensation chamber configured to receive the semiconductor package; and
a chiller configured to provide the condensation chamber with a condensation temperature of the gas.

6. The solder reflow system of claim 1, wherein the condensation apparatus comprises:
a condensation chamber configured to receive the semiconductor package; and
at least one nozzle arranged in the condensation chamber to inject a dry gas for condensing the gas into the condensation chamber.

7. The solder reflow system of claim 1, further comprising a return line connected between the solder reflow apparatus and the condensation apparatus to return the liquid in the condensation apparatus to the solder reflow apparatus.

8. The solder reflow system of claim 1, wherein the cleaning agent comprises deionized (DI) water.

9. The solder reflow system of claim 8, wherein the cleaning apparatus comprises an ultrasonic cleaning apparatus using the DI water.

10. The solder reflow system of claim 8, wherein the cleaning apparatus comprises a flush cleaning apparatus configured to use the DI water.

11. The solder reflow system of claim 1, further comprising a system chamber in which the solder reflow apparatus is disposed, the condensation apparatus and the cleaning apparatus.

12. The solder reflow system of claim 1, further comprising:
a first system chamber in which the solder reflow apparatus and the condensation apparatus are disposed; and
a second system chamber in which the cleaning apparatus is disposed.

13. The solder reflow system of claim 1, further comprising:
a first system chamber in which the solder reflow apparatus is disposed;
a second system chamber in which the condensation apparatus is disposed; and
a third system chamber in which the cleaning apparatus is disposed.

14. A solder reflow system comprising:
a solder reflow apparatus configured to reflow a solder of a semiconductor package using a heat transfer fluid;
a condensation apparatus configured to receive the semiconductor package processed by the solder reflow apparatus, the condensation apparatus configured to condense a gas generated from the heat transfer fluid to convert the gas into a liquid;
an inlet line connected between the solder reflow apparatus and the condensation apparatus to introduce the gas generated in the solder reflow apparatus into the condensation apparatus;
a cleaning apparatus configured to perform an ultrasonic cleaning process on the semiconductor package processed by the condensation apparatus using a deionized (DI) water; and
a return line connected between the solder reflow apparatus and the condensation apparatus to return the liquid in the condensation apparatus to the solder reflow apparatus.

15. The solder reflow system of claim 14, wherein the inlet line comprises:

a main duct extending from an upper surface of the solder reflow apparatus to an upper space of the condensation apparatus; and a plurality of branch ducts connected between the main duct and the condensation apparatus.

16. The solder reflow system of claim 14, wherein the condensation apparatus comprises:

a condensation chamber configured to receive the semi-conductor package; and a chiller configured to provide the condensation chamber with a condensation temperature of the gas.

17. A method of manufacturing a semiconductor device comprising:

reflowing a solder of a semiconductor package by performing vapor phase soldering comprising generating a superheated vapor by heating a heat transfer fluid in a reflow chamber, the superheated vapor comprising a gas;

obtaining, in a condensation chamber, at least a portion of the superheated vapor generated in the reflow chamber;

condensing, in the condensation chamber, the at least portion of the superheated vapor into a liquid; and cleaning the semiconductor package using a cleaning agent in a cleaning chamber.

18. The method of claim 17, further comprising returning the liquid in the condensation chamber to the reflow chamber.

19. The method of claim 17, wherein the cleaning agent comprises deionized (DI) water.

20. The method of claim 19, wherein the cleaning the semiconductor package comprises performing an ultrasonic cleaning process using the DI water.

\*   \*   \*   \*   \*